(12) United States Patent
Sharma

(10) Patent No.: US 6,936,479 B2
(45) Date of Patent: Aug. 30, 2005

(54) METHOD OF MAKING TOROIDAL MRAM CELLS

(75) Inventor: Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 37 days.

(21) Appl. No.: 10/758,659

(22) Filed: Jan. 15, 2004

(65) Prior Publication Data

US 2005/0158881 A1   Jul. 21, 2005

(51) Int. Cl.[7] .............................................. H01L 21/00
(52) U.S. Cl. ........................... 438/3; 257/295; 365/209
(58) Field of Search ............................ 438/3; 257/295

(56) References Cited

U.S. PATENT DOCUMENTS

| | | |
|---|---|---|
| 5,477,482 A | 12/1995 | Prinz |
| 5,541,868 A | 7/1996 | Prinz |
| 5,661,062 A | 8/1997 | Prinz |
| 6,351,410 B1 * | 2/2002 | Nakao et al. ................ 365/171 |
| 6,391,483 B1 * | 5/2002 | Zhu et al. .................... 428/692 |
| 6,600,314 B2 * | 7/2003 | Kou ............................ 324/252 |
| 6,649,953 B2 * | 11/2003 | Cha ............................ 257/295 |

OTHER PUBLICATIONS

Zhu, Jian-Gang et al., "Ultrahigh Density Vertical Magnetoresistive Random Access Memory (invited)," Journal of Applied Physics, May 2000, vol. 87, No. 9, pp. 6668–6673.

* cited by examiner

*Primary Examiner*—Thao P. Le

(57) ABSTRACT

This invention provides a method of making nano-scaled toroidal magnetic memory cells, such as may be used, for example, in magnetic random access memory (MRAM). In a particular embodiment a semiconductor wafer substrate is prepared and a conductor layer is provided upon the wafer. A hard layer is deposited upon the first conductor. From the hard layer, ion etching is employed to form an annular wall about a pillar, the wall and pillar defining an annular slot. A ferromagnetic data layer is deposited within the annular slot and a junction stack is then provided upon at least a portion of the data layer. A dielectric is applied to insulate the structure and then planarized to expose the pillar.

45 Claims, 6 Drawing Sheets

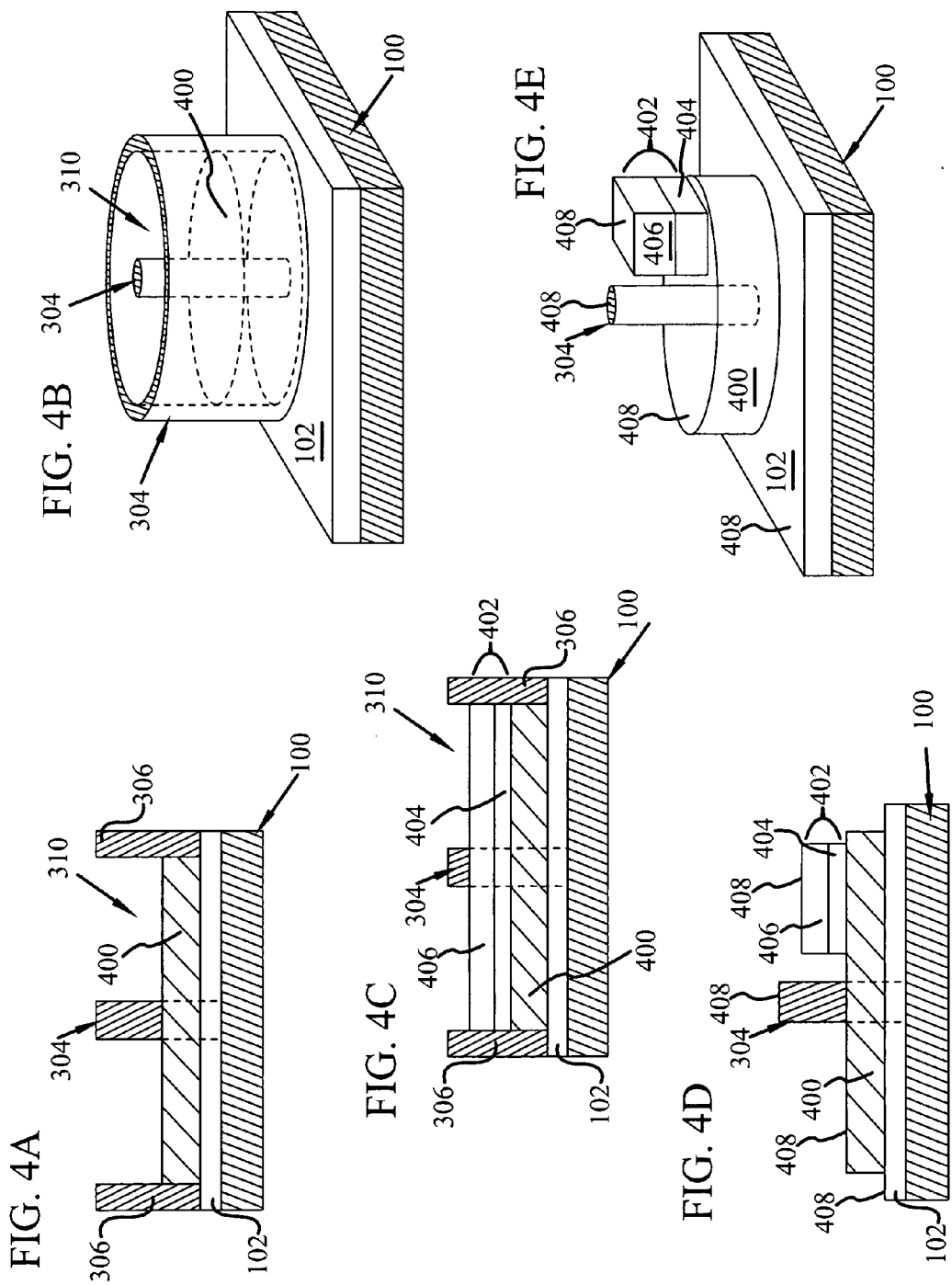

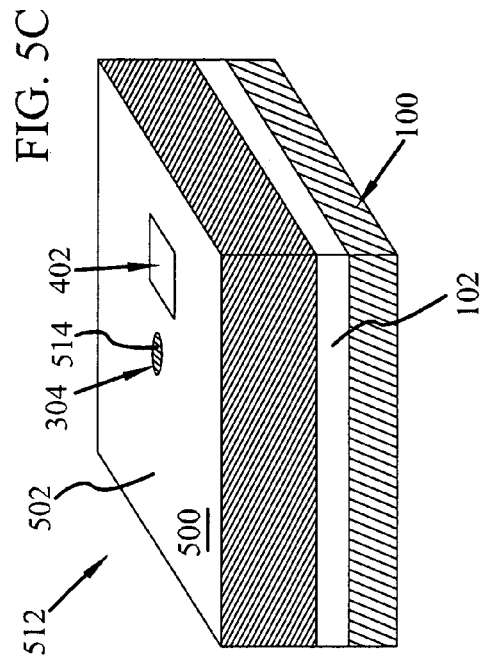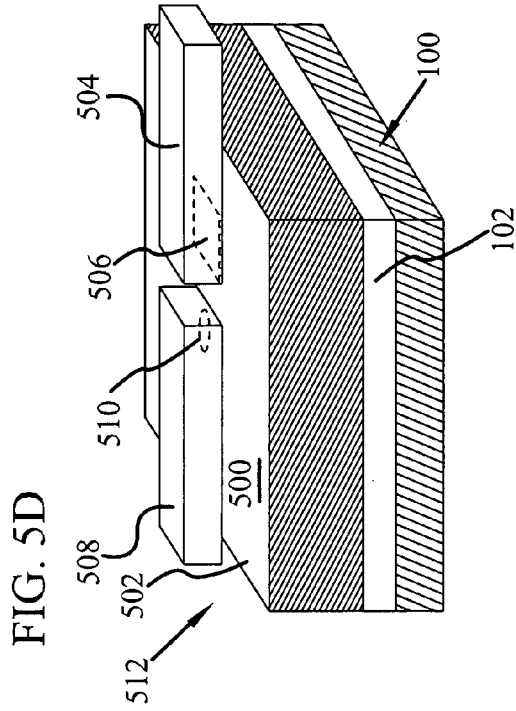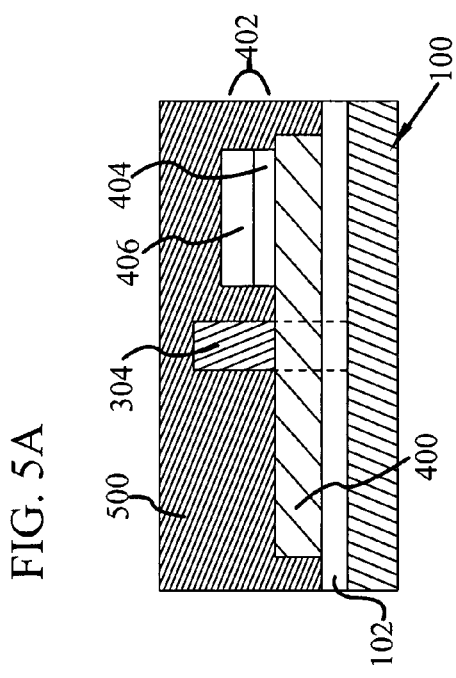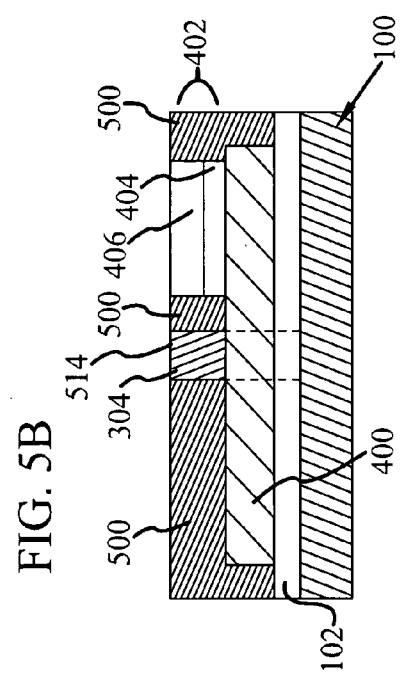

METHOD OF MAKING TOROIDAL MRAM CELLS

FIELD OF THE INVENTION

This invention relates generally to the manufacture of semiconductor devices such as high density magnetic random access memory (MRAM), and in particular to an improved method of making toroidal MRAM cells.

BACKGROUND OF THE INVENTION

In many of today's micro-electronics, smaller more compact sizing yields greater speed and processing power. Improved materials and precision in manufacturing permit greater resolution in semiconductor manufacturing.

Today's computer systems employ a variety of different types of semiconductors, such as processors and memory. Increased speed and sophistication of these systems is due in large part to reductions in the size of the semiconductor components. For example, whereas 32 megabytes of memory was once considered large, contemporary computer systems may provide several gigabytes in substantially the same physical space.

With respect to semiconductor memory structures, and specifically magnetic tunnel junction structures such as MRAM, the principle underlying the storage of data in a magnetic media (main or mass storage) is the ability to change and/or reverse the relative orientation of the magnetization of a storage data bit (i.e., the logic state of a "0" or a "1"). The coercivity of a material is the level of demagnetizing force that must be applied to a magnetic particle to reduce and/or reverse the magnetization of the particle. Generally speaking, the smaller the magnetic particle, the higher its coercivity.

A prior art magnetic memory cell may be a tunneling magnetoresistance memory cell (TMR), a giant magnetoresistance memory cell (GMR), or a colossal magnetoresistance memory cell (CMR), each of which generally include a data layer (also called a storage layer or bit layer), a reference layer, and an intermediate layer between the data layer and the reference layer. The data layer, the reference layer and the intermediate layer can be made from one or more layers of material.

The data layer is usually a layer of magnetic material that stores a bit of data as an orientation of magnetization that may be altered in response to the application of an external magnetic field or fields. More specifically, the orientation of magnetization of the data layer representing the logic state can be rotated (switched) from a first orientation, representing a logic state of "0", to a second orientation, representing a logic state of "1", and/or vice versa.

The reference layer is usually a layer of magnetic material in which an orientation of magnetization is "pinned", as in fixed, in a predetermined direction. Often several layers of magnetic material are required, and function as one to effectuate a stable, pinned reference layer. The predetermined direction is determined and established by microelectronic processing steps employed in the fabrication of the magnetic memory cell.

Typically, the logic state (a "0" or a "1") of a magnetic memory cell depends on the relative orientations of magnetization in the data layer and the reference layer. For example, when an electrical potential bias is applied across the data layer and the reference layer in a MTJ cell (also known as a tunnel junction memory cell), electrons migrate between the data layer and the reference layer through the intermediate layer. The intermediate layer is typically a thin dielectric layer commonly referred to as a tunnel barrier layer. The phenomena that cause the migration of electrons through the barrier layer may be referred to as quantum mechanical tunneling or spin tunneling.

The logic state may be determined by measuring the resistance of the memory cell. For example, if the overall orientation of the magnetization in the data storage layer is parallel to the pinned orientation of magnetization in the reference layer, the magnetic memory cell will be in a state of low resistance. If the overall orientation of the magnetization in the data storage layer is anti-parallel (opposite) to the pinned orientation of magnetization in the reference layer, the magnetic memory cell will be in a state of high resistance.

Main memory devices such as MRAM often employ tunnel junction magnetic memory cells positioned at the transverse intersections of electrically conductive rows and columns. Such an arrangement is known as a cross-point memory array.

In a typical cross-point memory array, while any given row (row A, B, C . . . ) may cross every column (column 1, 2, 3 . . . ), and visa-versa, the traditional principles of column and row arrays dictate that any given row will only cross any given column once. Therefore, by accessing a particular row (B) and a particular column (3), any one memory cell positioned at their intersection (B,3) can be isolated from any other memory cell in the array. Such individual indexing is not without complexities.

The data layer and reference layer may be thought of as stacked bar magnets, each long on the X axis and short on the Y axis. The magnetization of each layer has a strong preference to align along the easy axis, generally the long X axis. As with traditional bar magnets, the data layer and reference layer each have magnetic poles, one at either end of the easy axis. The lines of magnetic force that surround the data and reference layers are three-dimensional and flow from the North to the South pole.

The influence of the magnetic force surrounding a bar magnet can be widespread. A significant amount of space in an MRAM structure may be devoted to buffering space between MTJ cells so that the field of one MTJ does not inadvertently affect the field of a neighboring MTJ cell.

Ring magnets, otherwise known as toroidal or annular magnets, provide a substantially closed field. As the magnetic flux goes around the ring and closes upon itself, the amount of fringe field emanating from the lateral ends or from the top and bottom is minimized. Because of this, annular magnets generally can be placed side by side in close proximity. An important aspect of the annular magnet is its central hole, as the size and location of the hole directly affects the magnitude and profile of the magnetic field inside the magnet ring.

Generally speaking, semiconductors are manufactured through a layering process that provides two or more patterned conductive layers separated by intervening insulation layers. Considering the layers to be horizontally stacked, vertical points of contact between two or more conductive layers through the insulation layers are known as via structures, or more generally, via contacts. It is these via contacts that provide the wiring pattern for the semiconductor integrated circuit.

Throughout the history of manufacturing components, in almost all cases, the quality of production may be increased while costs are decreased when methods are found to simplify the processes. With respect to semiconductors and nano-scaled components, the use of photolithography is well known. Generally speaking, a layer of material is set down on a substrate. A photo-resist layer, also commonly know simply as a photoresist, or even resist, is then applied typically with a spin coating machine. A mask is then placed over the photoresist and light, typically ultra-violet (UV) light, is applied.

During the process of exposure, the photoresist undergoes a chemical reaction. Generally the photoresist will react in one of two ways. With a positive photoresist UV light changes the chemical structure of the photoresist so that it is soluble in a developer. What "shows" therefore goes, and the mask provides an exact copy of the pattern which is to remain. A negative photoresist behaves in the opposite manner—UV exposure causes it to polymerize and therefore resists dissolving by the developer. As such, the mask is a photographic negative of the pattern to be left. Following the developing process, "blocks" of photoresist remain. These blocks may be used for a variety of purposes, such as to protect portions of the initial layer during further processing or to serve as isolators or other components.

In many cases, the defined structures achieved by the masked and developed photoresist are repeated many times across a given layer. The masking process and the developing process do have inherent error margins. Further, as the creation of a mask is typically complex and cost intensive, use of a single large mask to mask an entire substrate all at once may not be desired. As a result, a smaller mask may be used repeatedly to achieve the affect of a single large mask; however, misalignment of the repeated maskings may waste material and/or result in an unusable wafer. In addition, the steps of masking and developing are distinct and each may require separate devices and setup times.

As noted above, vertical interconnections between layers are important aspects in semiconductor fabrication. For the application of an annular magnetic layer, a vertical interconnection will define the central hole and therefore affect the quality of the magnetic field. Prior art methods to accomplish conductive vertical interconnections between layers of materials have generally followed one of two paths. In one, a physical hole is etched, as in drilled, through a non-conductive layer and subsequently filled with a conductive material.

Such etching or drilling requires fine precision and control, for too much etching or drilling may damage, deplete or entirely remove the underlying layer to which the via contact is intended to contact. Akin to engraving a fine crystal bowl, the etching step occurs after the layer structures have been established. In other words, there is a substantial risk placed upon a step nearer the end of fabrication.

An alternative and potentially less risky method involves complex multi-step photolithography to define and undercut masking structures, which upon removal may provide a via contact. Whether dependent upon multiple masking, the use of resists of different developing speeds, or combinations of both, the process of providing via contacts is time consuming and difficult. Many factors can inadvertently affect the resulting size of a via contact, a factor that will directly affect the performance and ability of the semiconductor structure.

Photolithographic methods are also somewhat limited in how small a feature may be. This is in part due to each photolithographic step having inherent margins of error, which are compounded by each additional photolithographic step. Generally speaking, by making memory cells smaller, at least two important benefits result—more cells may be placed in the same physical space and the memory is likely to be faster. Presently, it has not been possible to render toroidal magnetic memory cells of a size in the 50 nm ~150 nm range.

Hence, there is a need for a method of providing MTJ cells which overcome one or more the drawbacks identified above. The present invention accomplishes this objective.

SUMMARY

This invention provides a method of fabricating nano-scaled toroidal magnetic memory cells.

In particular, and by way of example only, according to an embodiment of the present invention, this invention provides a method of making toroidal magnetic memory cells including: providing at least one first conductor; depositing a hard layer of material upon the first conductor; forming from the hard layer at least one pillar; depositing a ferromagnetic material about the pillar; forming an annular data layer from the ferromagnetic material about the pillar; depositing a junction stack upon at least a portion of the data layer; depositing a dielectric upon the junction stack; and planarizing the dielectric to expose the at least one pillar.

Moreover, according to an embodiment thereof, the invention may provide a method of making toroidal magnetic memory cells including: providing a wafer substrate; providing at least one first conductor upon the wafer substrate; depositing a hard layer of material upon the first conductor; forming from the hard layer at least one pillar; forming from the hard layer at least one substantially annular wall about each pillar, the annular wall about the pillar defining a substantially annular slot; depositing a ferromagnetic data layer within the annular slot; depositing a junction stack upon at least a portion of the data layer; depositing a dielectric upon the junction stack to insulate the junction stack; and planarizing the dielectric to expose the at least one pillar.

In yet another embodiment, the invention may provide a method of making toroidal magnetic memory cells having a common conductor, a read conductor and a write conductor, including: depositing a common conductive layer upon a wafer substrate; depositing a hard layer of material upon the common conductor layer; depositing a photoresist upon the material layer to provide at lest two areas of photoresist protected material, the first an annular ring concentric about a second protected area, the photoresist being developed to remove the photoresist from the non-protected area, thereby exposing at least one portion of the material layer; ion etching about the remaining photoresist to substantially remove at least a portion of the exposed portion of the material layer, the second protected area defining a pillar, the first protected area defining a substantially annular wall concentric about the pillar, the wall further defining a substantially annular slot about the pillar; depositing a ferromagnetic data layer within the annular slot; depositing a junction stack upon at least a portion of the data layer; removing the annular wall from around the data layer; depositing a dielectric upon the junction stack to insulate the junction stack; planarizing the dielectric to expose the at least one pillar; depositing a read conductor in electrical contact with the junction stack; wherein the pillar occupies the position of the write conductor, passing through the data layer and in electrical contact with the common conductive layer.

These and other objects, features and advantages of the preferred method and apparatus will become apparent from the following detailed description, taken in conjunction with the accompanying drawings which illustrate, by way of example, the principles of the invention.

BRIEF DESCRIPTION OF THE DRAWINGS

FIGS. 4a~4E provide cross sections and perspective views illustrating the application of the data layer and junction stack to the milled wafer of FIG. 3B;

FIGS. 5A~5D provide cross sections and perspective views of the final steps and resulting toroidal magnetic memory;

DETAILED DESCRIPTION

Figure 1C:
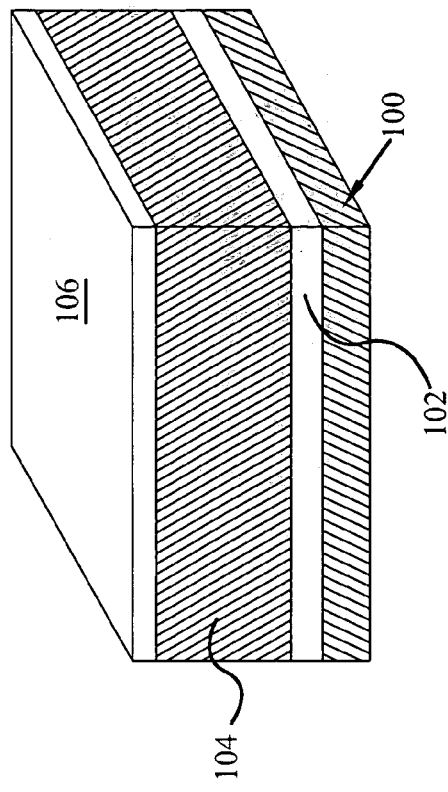
FIGS. 1A~1C provide perspective views illustrating the application of material to a wafer in the process of fabricating a toroidal magnetic memory cell, according to an embodiment of the present invention.

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Referring now to the drawings, FIGS. 1 through 5 conceptually illustrate a method of making a toroidal magnetic memory cell, illustrated in completed form as toroidal magnetic memory cell 512 in FIGS. 5C & 5D), such as may be used in magnetic random access memory (MRAM), according to an embodiment of the present invention. It will be appreciated that the described process need not be performed in the order in which it is herein described, but that this description is merely exemplary of one preferred method of fabricating toroidal magnetic memory cell 512. The description of the memory cell as a toroidal magnetic memory cell 512 is based upon the substantially annular nature of the data layer.

In at least one embodiment, the fabrication process may be commenced upon a semiconductor substrate wafer 100. Typically, the wafer 100 is chemically cleaned to remove any particulate matter, organic, ionic, and or metallic impurities or debris which may be present upon the surface of the wafer 100.

Figure 1A:
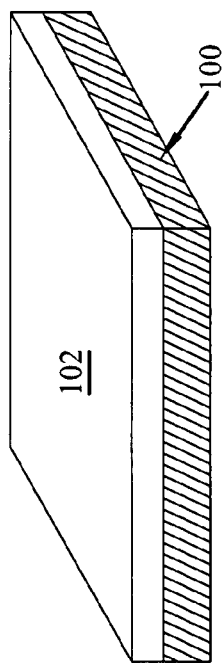

As shown in FIG. 1A, a first conductor layer 102 is deposited upon a semiconductor substrate wafer 100. The deposition of the conductor layer 102 may be by sputtering, ion beam deposition, electron beam evaporation, or such other appropriate method. In certain applications, the resulting toroidal magnetic memory cell 512 shown in FIGS. 5C & 5D may be joined to a common conductor. Access of a particular toroidal magnetic memory cell 512 may then be accomplished by the use of an articulating nanoprobe that provides at least one additional conductor to the top of toroidal magnetic memory cell 512.

In applications requiring faster memory access, such as main memory MRAM, it is more common to access a particular toroidal magnetic memory cell 512 by the use of transverse row and column conductors that electrically contact the top and bottom of a given toroidal magnetic memory cell 512. In applications including such row and/or column placement, the process of photolithography may be used to provide a base of these features prior to the depositing of the conductor layer 102. Under appropriate circumstances, the conductor layer 102 itself may be a row or column conductor.

Figure 1B:
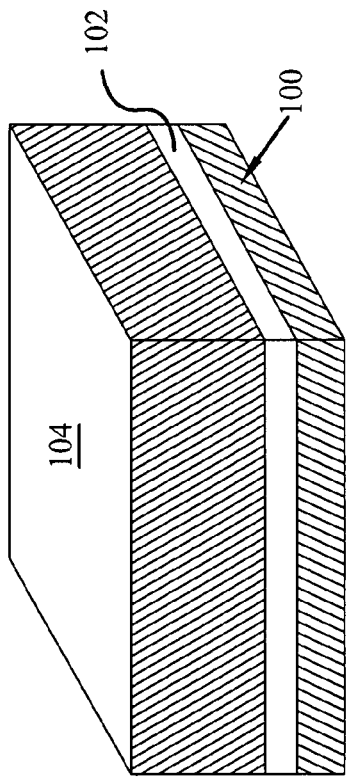

A hard material layer 104, hereinafter referred to as "hard layer" 104, is deposited upon the first conductor layer 102, as shown in FIG. 1B. As used herein, it is understood and appreciated that it is the reluctant property of this layer that is "hard". As with the deposition of the conductor layer 102, the hard layer 104 may be deposited by sputtering, ion beam deposition, electron beam evaporation, or such other appropriate method. In at least one embodiment, the hard layer 104 is substantially thick. More specifically, the thickness of the hard layer 104 is at least equal to, if not greater than, the height of the toroidal magnetic memory cell 512 to be fabricated. The hard layer 104 maybe be Silicon, Silicon Dioxide, Silicon Carbon, Silicon Nitride, or other appropriately hard material or polymer permitting the fabrication of features with high aspect ratios through ion milling/etching processes. In addition, in at least one embodiment, the hard layer 104 is electrically conductive.

As shown in FIG. 1C, a layer of photoresist 106 is applied upon the hard layer 104. In at least one embodiment, the photoresist 106 is a positive photoresist. Application of the photoresist 106 may be by the technique commonly known as "spin coating." Briefly stated, the wafer 100 is placed in a high-speed centrifuge also providing a vacuum environment. While rotated at a speed of between 3000 to 6000 RPM, a small quantity of photoresist is deposited at the center of the spinning wafer 100. The rotation causes the photoresist to spread out across the surface of the wafer 100 in a substantially uniform thickness. Generally, the wafer 100 is then baked gently in an oven to evaporate the photoresist solvents and partially solidify the photoresist.

A photo mask is created by known photographic methods upon a glass substrate, thus providing a mask 200. The mask is aligned with the wafer 100 so that the pattern 202 may be transferred onto the surface of the photoresist 106 (see FIG. 2A). Following alignment of the mask 200, the photoresist is exposed through the pattern 202 on the mask 200 with a high intensity light 204. The wavelength of the light used is dependent upon the resolution of the structures to be produced upon the wafer 100.

The light may be visible light, ultra-violet (UV), deep-UV (DUV), extreme-UV (EUV), or even X-ray. There are generally understood to be three primary methods of exposure: contact, where the mask 200 is placed in direct contact with the surface of the photoresist 106; proximity, where the mask 200 is placed in close proximity (10 to 20 microns) to the photoresist 106; and projection, where the mask is projected upon the photoresist 106 from a greater distance. Such projection exposure may be desired as it reduces the possible damage to the mask 200 from contact or proximity exposure, and more significantly permits very small resolution, allowing for nanometer-scaled production work.

Figure 2A:
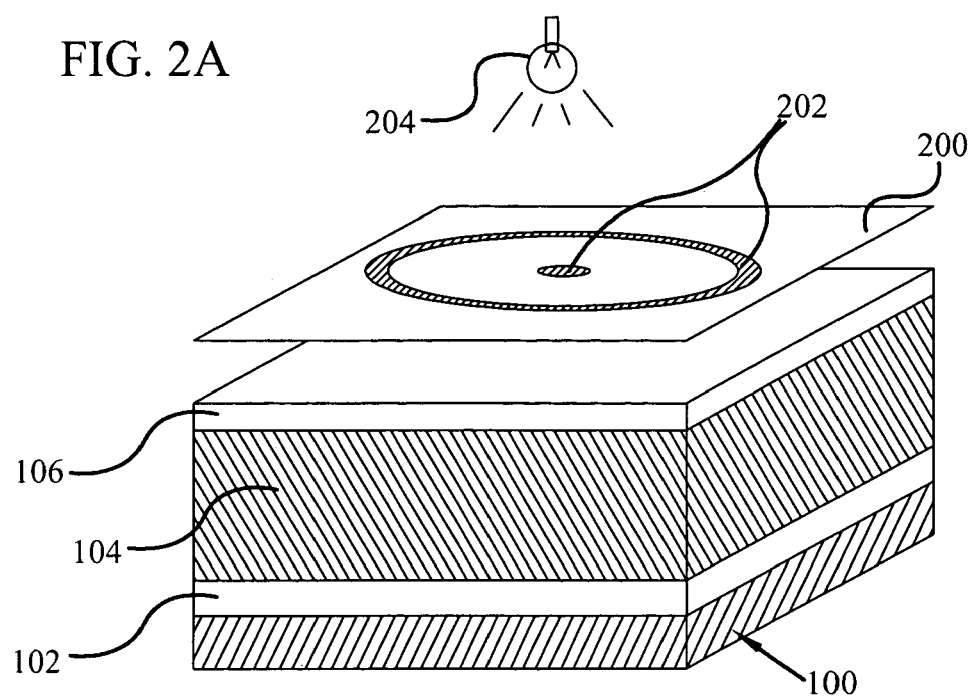
FIGS. 2A and 2B provide perspective views illustrating the protective photoresist caps applied to the layered wafer of FIG. 1C.
Figure 2B:
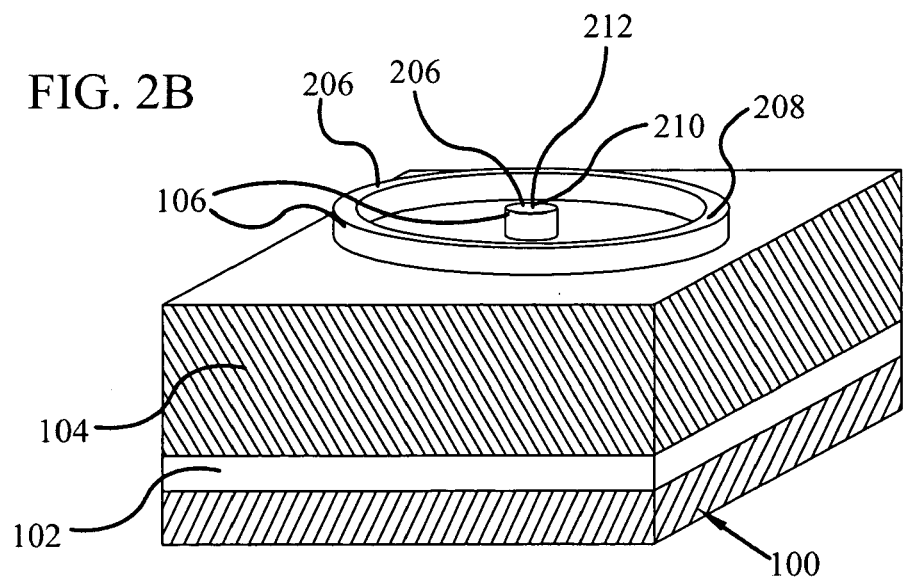

With a positive resist, the exposed portions of the photoresist 106 become soluble to a developer. As shown in FIG. 2B, the developing process removes the soluble portion of the photoresist 106 from the non-protected areas and results in photoresist caps 206 patterned to protect areas of the hard layer 104. More specifically, the masking of the photoresist provides at least two areas of photoresist protected material, the first a substantially annular ring 208 concentric about a second area 210.

In at least one embodiment, the second area 210 is a substantially circular cap 212. Generally, the wafer 100 is baked to harden the remaining photoresist caps 206 (the ring 208 and circular cap 212). Alternative methods to provide the annular ring 208 and the second area 210, such as, but not limited to, electron-beam lithography or nanoimprint lithography may also be used.

The sides of the remaining photoresist caps 206 substantially define the shape of a ferromagnetic data layer to be produced in the toroidal magnetic memory cell 512 (see FIGS. 4A–4E). As noted above, although photolithographic processes permit small scale fabrication, inherent factors do provide margins of error and limitations in scale. With each repeated photolithographic step, these margins of error and limitations can be compounded, thus limiting the overall size of the semiconductor component being fabricated.

Figure 3A:
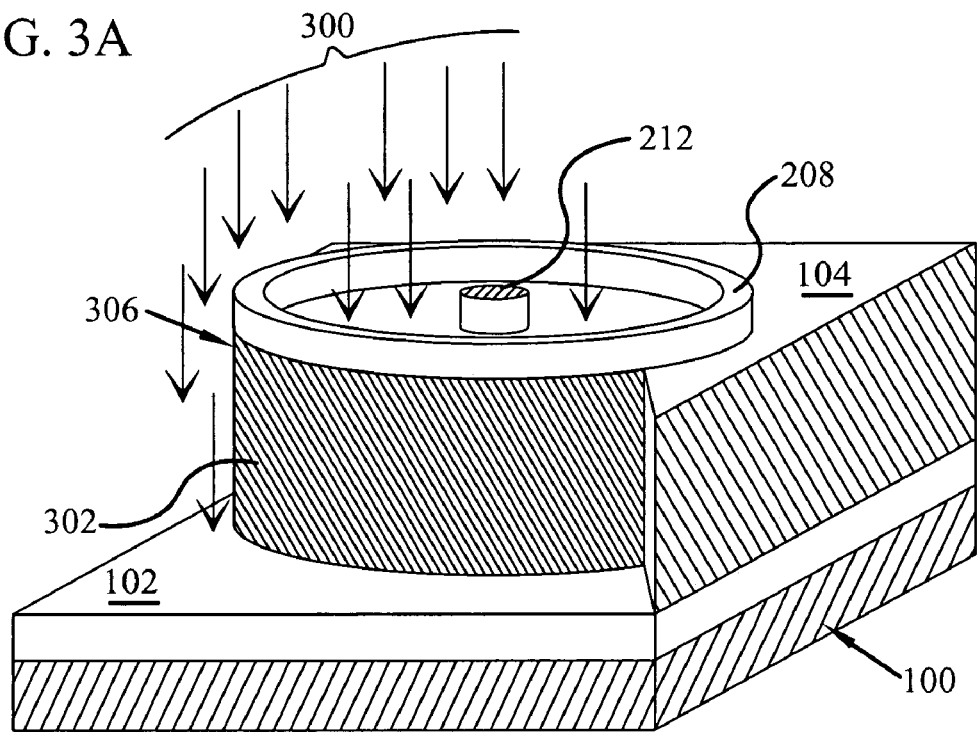
FIGS. 3A and 3B provide perspective views illustrating ion etching as is performed upon the layered wafer of FIG. 1C.

A significant reduction in the size of the toroidal magnetic memory cell 512 may be achieved through the use of ion etching. Specifically, the sides of the remaining photoresist ring 208 and circular cap 212 define guides for the ion etching process. As shown in FIG. 3A, the ion beam (represented by arrows 300) is approaching the wafer 100 at a high angle. More specifically, the ion beam 300 is approaching the wafer at a substantially perpendicular angle. A substantially perpendicular angle permits the resultant side walls 302 of the formed pillar 304 and annular wall 306 to be substantially perpendicular to the wafer 100 (see FIG. 3B). In at least one embodiment the pillar 304 is substantially cylindrical.

It is generally understood that an ion etching process may be accomplished by either of two traditional processes—a physical process or an assisted physical process. In a physical etching environment, no chemical agent is provided. Rather, the removal of material is entirely dependent upon the physical impact of the ions knocking atoms off the material surface by physical force alone. Physical ion etching is commonly referred to as ion milling or ion beam etching.

In an assisted physical process such as a reactive ion etching process, or RIE, removal of material comes as a combined result of chemical reactions and physical impact. Generally, the ions are accelerated by a voltage applied in a vacuum. The effect of their impact is aided by the introduction of a chemical which reacts with the surface of the semiconductor being etched. The reaction makes the surface softer and, as such, increases both the relative control of the etching as well as the etching rate.

An RIE process advantageously permits very accurate etching of the hard layer 104. Specific selection of different materials further permits an RIE process to soften one layer without significantly softening another. Advantageously, the softening of the hard layer 104 induced by the RIE process allows for substantially precise removal of exposed portions of the material layer without substantially significant etching of the underlying wafer substrate.

In at least one embodiment, the ion etching to remove the exposed portions of the hard layer 104 is by an assisted physical process such as RIE. The type of directed ions used for both methods, and the type of chemical(s) assistant in RIE, may very depending upon the nature of the material being removed.

Under appropriate circumstances, the angle of the ion beam 300 may be adjusted so as to achieve an angular slope in the side walls 302. As indicated above, the material comprising the hard layer 104 permits the formation via ion etching of features with high aspect ratios. It is easily appreciated that the height of the pillar 304 and annular wall 306 may be quite large. Specifically the pillar 304 and annular wall 306 have a height and width, the aspect ratio of the height to the width (and or length) being substantially between 2 and 30.

Ion etching as taught herein permits the elimination of photolithographic steps that would otherwise be required to define and establish the location of the central conductor and the annular shape of the data layer 400 (See FIG. 4). As such, the incorporation of ion milling in the fabrication process permits toroidal magnetic memory cells 512 to be fabricated on a scale of 50 nm~150 nm in diameter, a heretofore unobtainable size.

Figure 3B:
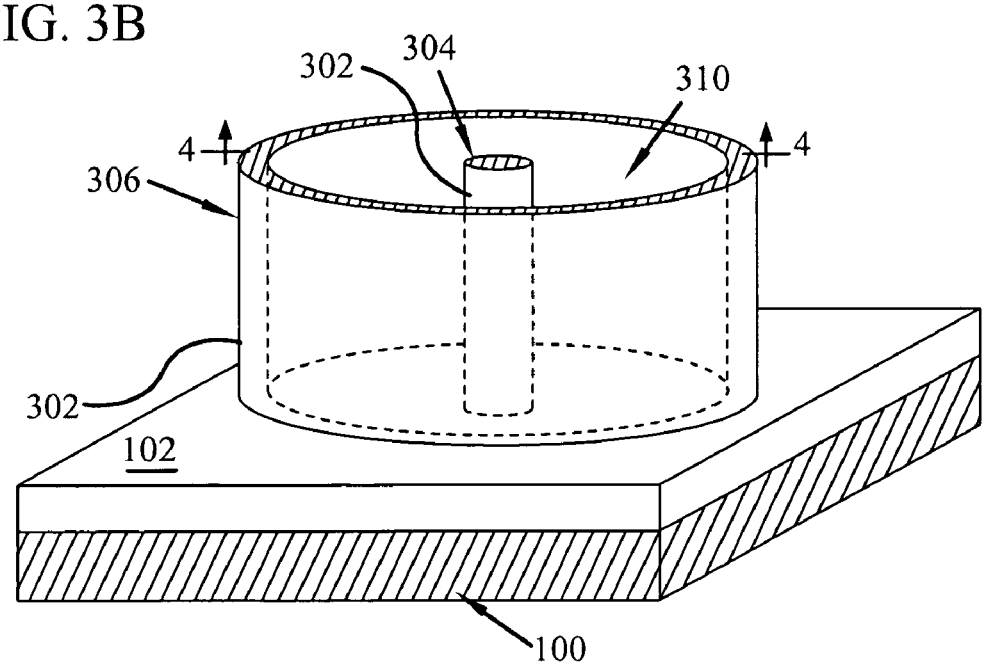

Following the process of ion milling, the remaining photoresist ring 208 and circular cap 212 may be removed. Generally, such removal is accomplished by washing the wafer 100 with a photoresist dissolving agent such that substantially all of the remaining photoresist is removed and the pillar 304 and annular wall 306 remain. As shown in FIG. 3B, the substantially annular wall 306 and pillar 304 define a substantially annular slot 310. Under appropriate circumstances, this annular slot 310 may be concentric about the pillar 304.

FIGS. 4A, 4C and 4D provides a cross section portion of the perspective shown in FIG. 3B. Toroidal magnetic memory cell 512 is understood and appreciated to operate as a magnetic tunnel junction (MTJ) cell. As such, the eventual toroidal magnetic memory cell 512 may be comprised of a ferromagnetic data layer 400, and a junction stack 402. The junction stack 402 may be comprised of an intermediate barrier layer 404 and a ferromagnetic reference layer 406. More specifically, and as will be appreciated with respect to FIGS. 4D & 4E, the junction stack 402 is characterized by an intermediate layer 404 in contact with the data layer 400, and a reference layer 406 in contact with the intermediate layer 404, opposite from the data layer 400.

As shown in FIG. 4A, a layer of ferromagnetic material with appropriate magnetic properties is deposited within the annular slot 310, to result in annular data layer 400. FIG. 4B conceptually illustrates a perspective view of the annular data layer 400 disposed within annular slot 310 as defined by the annular wall 306 and the pillar 304. An annular data layer 400 is advantageous as there are no demagnetizing fields at its side edges due to geometric shape anisotropy. As indicated by dotted lines in FIG. 4A, pillar 304 passes through the data layer 400, therefore defining the annular data layer 400 substantially as a ring. At smaller dimensions, shape anisotropy can increase the Hc (the magnetic switching field) necessary to re-orient the magnetization of the data layer and make the data layer difficult to switch. Annular data layer 400 advantageously does not have this problem.

Following the formation of the annular data layer 400, the appropriate layers comprising the junction stack 402 are deposited upon at least a portion of the data layer 400. As shown in FIG. 4C, the source materials of the junction stack 402 may be provided across the data layer. Through appropriate photolithographic processes or other methods, an appropriate area for the junction stack 402 is defined and the annular wall 306 is removed, as shown in FIGS. 4D and 4E. As illustrated, the resulting junction stack is not concentric to the data layer 400.

More specifically, in at least one embodiment, the junction stack 402 is asymmetrically placed over only a portion of the data layer 400. In addition, in at least one embodiment, the intermediate layer 404 and the reference layer 406 may be not be round. Rather, they may be substantially rectangular, as shown. As the reference layer 406 is substantially smaller than the data layer 400, the effect of edge fields emanating from the reference layer 406 will be minimized. Further, as the reference layer 406 may be a soft-reference layer, the soft-reference layer will orient when and if an external field is applied, but otherwise will not sustain an orientation or provide edge fields.

In further addition, it will be noted that the junction stack 402 is not in electrical or physical contact with the pillar 304. The use of an asymmetrically placed junction stack 402 simplifies the fabrication process by eliminating additional insulating layers, or the need to provide them prior to providing the junction stack 402, around the pillar 304 between the data layer 400 and the reference layer 406. Such insulation would otherwise be necessary, for any inadvertent electrical contact would defeat the ability to sense resistance within the toroidal magnetic memory cell 512. It is intended that a dielectric 500 (see FIG. 5A) be applied to further help insulate and protect the components of the toroidal magnetic memory cell 512, however, even without such a dielectric 500, the disclosed method provides for electrical isolation as between the junction stack 402 and the data layer 400 central conductor.

A cap layer (not shown) may also be provided to protect the top of the junction stack 402 from oxidation when exposed to the atmosphere during the fabrication process. The reference layer 406 may be a pinned or soft reference layer. In at least one embodiment, the reference layer 406 is a soft-reference layer, having its orientation pinned-on-the fly to the orientation of an applied magnetic field.

In at least one embodiment, the intermediate layer 404 is a tunnel layer made from an electrically insulating material (a dielectric) that separates and electrically isolates the data layer 400 from the reference layer 406. Suitable dielectric materials for the dielectric intermediate layer 404 may include but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 404 is a tunnel layer made from a non-magnetic material such as a 3$d$, a 4$d$, or a 5$d$ transition metal listed in the periodic table of the elements. Suitable non-magnetic materials for a non-magnetic intermediate layer 404 may include but are not limited to: Copper (Cu), Gold (Au) and Silver (Ag). While the actual thickness of the intermediate layer 404 is dependent upon the materials selected to create the intermediate layer 404 and the type of tunnel memory cell desired, in general, the intermediate layer 404 may have a thickness of about 0.5 nm to about 5.0 nm.

Illustrated in FIG. 5A, a dielectric 500 is deposited by an appropriate process upon substantially all of the exposed surface 408 (see FIGS. 4D and 4E). The dielectric 500 may be of substantially the same material as may be used for the intermediate layer 404. As conceptually shown in FIG. 5A, the dielectric 500 may be applied to a thickness that is at least as great as the height of pillar 304.

In at least one embodiment, the hard layer 104 is an electrically conductive material. As such, the pillar 304 forms a second conductor running through the annular data layer 400. Pillar 304 may also be said to function as a self-aligned via contact, through the data layer 400 to the conductor layer 102. In such instances, the pillar 304 advantageously serves at least two functions—the first in serving to help define the annular data layer 400, and the second in acting as a write conductor for the data layer 400.

Figure 6A:
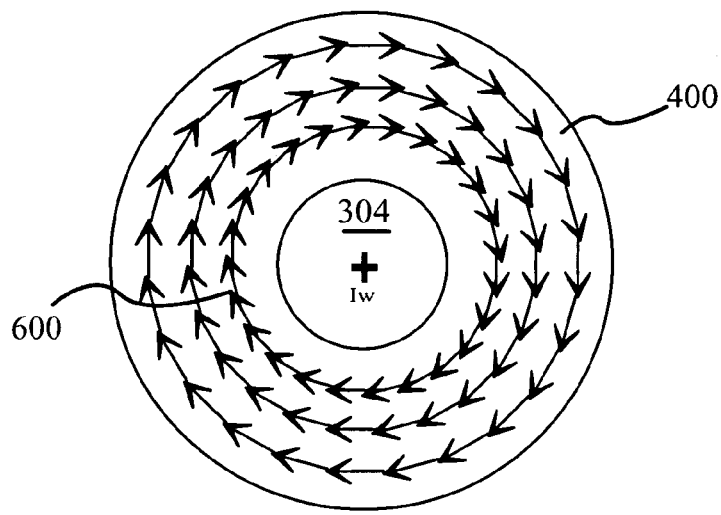
FIGS. 6A and 6B illustrate the magnetic field within the data layer of the toroidal magnetic memory.
Figure 6B:
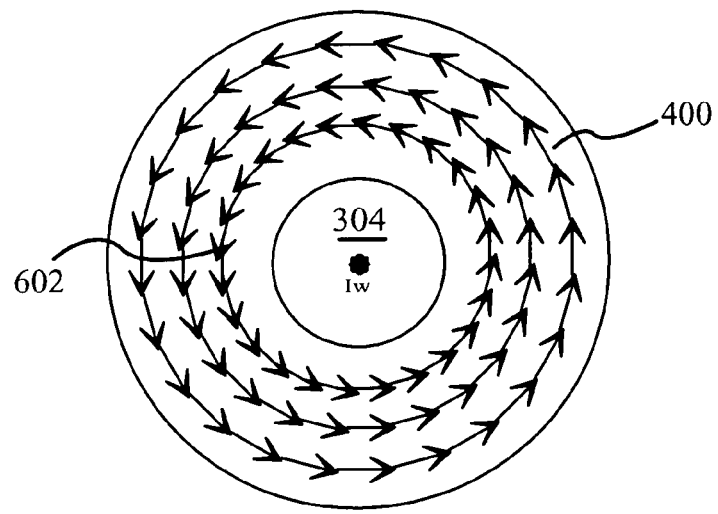

More specifically, when an electrical current is applied to the pillar 304, the current will generate a magnetic field in accordance with the right-hand rule, corresponding to the direction of the current. FIGS. 6A and 6B conceptually illustrate the relative magnetic field of the data layer 400. In FIG. 6A the current $I_w$ is flowing into the page, as illustrated by the "+", and the resultant magnetic field, represented by arrows 600, is clockwise. In FIG. 6B the current $I_w$ is flowing out of the page, as illustrated by the ".", and the resultant magnetic field, represented by arrows 602, is counter-clockwise. With respect to these figures, the lack of demagnetizing edge fields may be further appreciated.

To provide electrical contact to the pillar 304 and the top of the junction stack 402, the top of the wafer 100, now covered with dielectric 500, is planarized. In at least one embodiment, this is accomplished by the technique of chemical and mechanical polishing planarization (CMP planarization). The result of such planarization is a substantially smooth top surface and the exposure of tops of the pillar 304 and junction stack 402, see FIGS. 5A and 5B.

In embodiments where the hard layer 104 is not electrically conductive, and the resulting pillar 304 is therefore not conductive, the pillar 304 may be removed and replaced with an electrically conductive material. As illustrated, the planarized dielectric 500 provides electrical isolation between the junction stack 402 and the pillar 304, or the material replacing the pillar 304. As such, a write current applied to the toroidal magnetic memory cell 512 does not inadvertently damage the junction stack 402.

More specifically, the requirements for a write operation have been isolated from those of a read operation. As such, the structures of the junction stack 402 need only contend with the physical requirements of a read operation—involving less current and robustness than otherwise required with a write operation.

To provide a third conductor (i.e. a read conductor) in electrical contact with the junction stack 402, a photolithographic process substantially similar to that described above may be used. More specifically, a conductive layer (not shown) may be deposited upon the exposed surface 502 of the wafer 100, thereby contacting the self-aligned via contact provided by the top of the pillar 304 and the top of the junction stack 402. A photoresist layer is then deposited by appropriate means upon the conductive layer. A mask with appropriate masked areas is properly aligned, and the photoresist is exposed through the mask and then developed appropriately.

The exposed portions of the conductive layer are then etched by appropriate methods such that the portions of the conductive layer not protected by the patterned photoresist are removed. As shown in FIG. 5D, the remaining photoresist is then dissolved or otherwise removed such that at least a third conductor 504 is provided in contact with the top of the junction stack 402, illustrated as dotted square 506.

The third conductor 504 may also be identified as a read conductor, as it provides the current to the junction stack for the purpose of determining the resistance within the toroidal magnetic memory cell 512 as a result of the magnetic orientations of the data layer 400 and the reference layer 406. As shown, an additional conductor 508 may be also be provided in contact with the top of the electrically conductive pillar 304, or electrically conductive material that has replaced pillar 304, illustrated as dotted circle 510.

It is further understood and appreciated that the orientations of the conductors 504 and 508 are for illustrative purposes. Where the toroidal magnetic memory cell 512 is to be located in a cross point array, such as is typical for use in main memory applications, the conductors 504 and 508 may be oriented as necessary to properly align with the appropriate column and/or row conductors of the cross point array.

As described above, the junction stack 402 may be said to be placed on top of the data layer 400. In an alternative embodiment, the toroidal magnetic memory cell 512 may inverted such that the junction stack 402 is set down first and the data layer 400 is subsequently placed upon the junction stack 402. In such an arrangement, it is understood and appreciated that in place of a single initial conductor layer 102, there will be two—the sense conductor and third additional conductor. In such an order of arrangement, the junction stack 402 will be deposited upon the appropriate read conductor before the annular data layer 400 is deposited. In addition, the annular wall 306 will not be removed prior to the junction stack 402 being deposited, as such annular wall 306 will be used to define the annular shape of the data layer 400, the data layer 400 being deposited onto the junction stack 402.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

I claim:

1. A method of making toroidal magnetic memory cells comprising:
   providing at least one first conductor;
   depositing a hard layer of material upon the first conductor;
   forming from the hard layer at least one pillar;
   depositing a ferromagnetic material about the pillar;
   forming an annular data layer from the ferromagnetic material about the pillar;
   depositing a junction stack upon at least a portion of the data layer;
   depositing a dielectric upon the junction stack; and
   planarizing the dielectric to expose the at least one pillar.

2. The method of claim 1, wherein the formation of the at least one pillar further includes:
   depositing a photoresist upon the material layer;
   masking the photoresist to provide at least two areas of photoresist protected material, the first an annular ring concentric about a second area, the photoresist being developed to remove the photoresist from the non-protected area, thereby exposing at least one portion of the material layer; and
   ion etching about the remaining photoresist to substantially remove at least a portion of the exposed portion of the material layer, the second protected area defining the pillar, the first protected area defining a substantially annular wall concentric about the pillar.

3. The method of claim 2, wherein the ion etching is accomplished by RIE.

4. The method of claim 1, wherein the planarizing is by chemical mechanical polishing (CMP).

5. The method of claim 1, wherein the material of the hard layer is selected from the group consisting of Silicon, Silicon Dioxide, Silicon Carbon, and Silicon Nitride.

6. The method of claim 1, wherein the at least one pillar is cylindrical.

7. The method of claim 1, wherein the junction stack is asymmetrically placed upon the data layer.

8. The method of claim 1, wherein the resulting toroidal memory cell has a diameter of about 50 nanometers to 150 nanometers.

9. The method of claim 1, wherein the at least one pillar is characterized by a length, a width and a height, the aspect ratio of the height to the length to the width being substantially between 2 and 30.

10. The method of claim 1, wherein the material of the hard layer is conductive material.

11. The method of claim 10, wherein the at lest one pillar forms a second conductor through the annular data layer.

12. The method of claim 1, further including forming a third conductor in electrical contact with the junction stack.

13. The method of claim 1, wherein the junction stack is characterized by an intermediate layer in contact with the data layer, and a reference layer in contact with the intermediate layer, opposite from the data layer.

14. The method of claim 13, wherein the reference layer is a soft-reference layer.

15. The method of claim 1, further including replacing the at least one pillar with a conductive material after planarizing.

16. The method of claim 1, further comprising at least two first conductors, wherein the junction stack is deposited upon one of the first at least two first conductors before the data layer is deposited.

17. A method of making toroidal magnetic memory cells comprising:
   providing a wafer substrate;
   providing at least one first conductor upon the wafer substrate; depositing a hard layer of material upon the first conductor;
   forming from the hard layer at least one pillar;
   forming from the hard layer at least one substantially annular wall about each pillar, the annular wall about the pillar defining a substantially annular slot;
   depositing a ferromagnetic data layer within the annular slot;
   depositing a junction stack upon at least a portion of the data layer;
   depositing a dielectric upon the junction stack to insulate the junction stack; and
   planarizing the dielectric to expose the at least one pillar.

18. The method of claim 17, wherein the formation of the at least one pillar and the annular wall further includes:
   depositing a photoresist upon the material layer;
   masking the photoresist to provide at least two areas of photoresist protected material, the first an annular ring concentric about a second area, the photoresist being developed to remove the photoresist from the non-protected area, thereby exposing at least one portion of the material layer; and
   ion etching about the remaining photoresist to substantially remove at least a portion of the exposed portion of the material layer, the second protected area defining the pillar, the first protected area defining a substantially annular wall concentric about the pillar.

19. The method of claim 18, wherein the ion etching is accomplished by RIE.

20. The method of claim 17, wherein the planarizing is by chemical mechanical polishing (CMP).

21. The method of claim 17, wherein the material of the hard layer is selected from the group consisting of Silicon, Silicon Dioxide, Silicon Carbon, and Silicon Nitride.

22. The method of claim 17, wherein the at least one pillar is cylindrical.

23. The method of claim 17, wherein the junction stack is asymmetrically placed upon the data layer.

24. The method of claim 17, wherein the resulting toroidal memory cell has a diameter of about 50 nanometers to 150 nanometers.

25. The method of claim 17, wherein the at least one pillar is characterized by a length, a width and a height, the aspect ratio of the height to the length to the width being substantially between 2 and 30.

26. The method of claim 17, wherein the material of the hard layer is conductive material.

27. The method of claim 26, wherein the at least one pillar forms a second conductor through the ferromagnetic data layer.

28. The method of claim 17, further including forming a third conductor in electrical contact with the junction stack.

29. The method of claim 17, wherein the junction stack is characterized by an intermediate layer in contact with the data layer, and a reference layer in contact with the intermediate layer, opposite from the data layer.

30. The method of claim 29, wherein the reference layer is a soft-reference layer.

31. The method of claim 17, further including removing the annular wall after the ferromagnetic data layer is deposited.

32. The method of claim 17, further including replacing the at least one pillar with a conductive material after planarizing.

33. The method of claim 17, further comprising at least two first conductors, wherein the junction stack is deposited upon one of the first at least two first conductors before the data layer is deposited.

34. A method of making toroidal magnetic memory cells having a common conductor, a read conductor and a write conductor, comprising:
  depositing at least one common conductive layer upon a wafer substrate;
  depositing a hard layer of material upon the common conductor layer;
  depositing a photoresist upon the material layer to provide at least two areas of photoresist protected material, the first an annular ring concentric about a second protected area, the photoresist being developed to remove the photoresist from the non-protected area, thereby exposing at least one portion of the material layer;
  ion etching about the remaining photoresist to substantially remove at least a portion of the exposed portion of the material layer, the second protected area defining a pillar, the first protected area defining a substantially annular wall concentric about the pillar, the wall further defining a substantially annular slot about the pillar;
  depositing a ferromagnetic data layer within the annular slot;
  depositing a junction stack upon at least a portion of the data layer;
  removing the annular wall from around the data layer;
  depositing a dielectric upon the junction stack to insulate the junction stack;
  planarizing the dielectric to expose the at least one pillar;
  depositing a read conductor in electrical contact with the junction stack;
  wherein the pillar occupies the position of the write conductor, passing through the data layer and in electrical contact with the common conductive layer.

35. The method of claim 34, wherein the at least one pillar is conductive and acts as the write conductor.

36. The method of claim 34, wherein the ion etching is accomplished by RIE.

37. The method of claim 34, wherein the planarizing is by chemical mechanical polishing (CMP).

38. The method of claim 34, wherein the material of the hard layer is selected from the group consisting of Silicon, Silicon Dioxide, Silicon Carbon, and Silicon Nitride.

39. The method of claim 34, wherein the at least one pillar is cylindrical.

40. The method of claim 34, wherein the junction stack is asymmetrically placed upon the data layer.

41. The method of claim 34, wherein the resulting toroidal memory cell has a diameter of about 50 nanometers to 150 nanometers.

42. The method of claim 34, wherein the junction stack is characterized by an intermediate layer in contact with the data layer, and a reference layer in contact with the intermediate layer, opposite from the data layer.

43. The method of claim 42, wherein the reference layer is a soft-reference layer.

44. The method of claim 34, further including replacing the at least one pillar with a conductive material after planarizing.

45. The method of claim 34, further comprising at least two first conductors, wherein the junction stack is deposited upon one of the first at least two first conductors before the data layer is deposited.

* * * * *